(12) United States Patent
Matsumoto et al.

(10) Patent No.: US 8,288,775 B2
(45) Date of Patent: Oct. 16, 2012

(54) PHOTOELECTRIC CONVERSION ELEMENT, PHOTOELECTRIC CONVERSION DEVICE, AND IMAGE SENSOR

(75) Inventors: Tomotaka Matsumoto, Matsumoto (JP); Tsukasa Eguchi, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 185 days.

(21) Appl. No.: 12/509,037

(22) Filed: Jul. 24, 2009

(65) Prior Publication Data
US 2010/0078637 A1  Apr. 1, 2010

(30) Foreign Application Priority Data

Oct. 1, 2008 (JP) ................... 2008-256082

(51) Int. Cl.
*H01L 27/14* (2006.01)
(52) U.S. Cl. ............ 257/72; 257/59; 257/290; 257/291; 257/292

(58) Field of Classification Search .................... 257/59, 257/72, 290, 291, 292
See application file for complete search history.

(56) References Cited

U.S. PATENT DOCUMENTS

| 6,809,358 B2 * | 10/2004 | Hsieh et al. | 257/291 |
| 2007/0290246 A1 * | 12/2007 | Zhang et al. | 257/294 |
| 2008/0128698 A1 * | 6/2008 | Martin et al. | 257/55 |

FOREIGN PATENT DOCUMENTS
JP    A-11-121731    4/1999
* cited by examiner

*Primary Examiner* — Tan N Tran
(74) *Attorney, Agent, or Firm* — Oliff & Berridge, PLC (57) ABSTRACT

A photoelectric conversion element includes a light receiving layer that is formed of microcrystal semiconductor, a first semiconductor layer of a first conductive type that is formed on one face side of the light receiving layer, and a first intermediate layer that is interposed between the first semiconductor layer and the light receiving layer and is formed of amorphous semiconductor.

5 Claims, 6 Drawing Sheets

PHOTOELECTRIC CONVERSION ELEMENT, PHOTOELECTRIC CONVERSION DEVICE, AND IMAGE SENSOR

BACKGROUND

1. Technical Field

The present invention relates to technical fields of a photoelectric conversion element such as a PIN diode, a photoelectric conversion device including the photoelectric conversion element, and an image sensor including the photoelectric conversion device.

2. Related Art

As an example of a sensor of such a type, an image sensor that is driven as an active matrix type has been disclosed (for example, see JP-A-11-121731). In the above-described image sensor, a PIN diode that is formed by laminating a p-type semiconductor layer (p layer), a light receiving layer (i layer) that is formed of an amorphous semiconductor layer, and an n-type semiconductor layer (n layer) together is used as a photoelectric conversion element.

Here, in order to improve the detection capability for detecting a detection target, there has been a request to improve the sensitivity for detecting infrared rays. However, in a photoelectric conversion element such as a PIN diode that is used in an image sensor of such a type, there is a trade-off relationship between the increase in the sensitivity for infrared rays and the detection of minute amounts of light. Accordingly, it is technically difficult to combine an increasing sensitivity for infrared rays and detecting minute amounts of light. In addition, it is difficult to increase the detection capability of the image sensor up to the wavelength range of infrared rays.

SUMMARY

An advantage of some aspects of the invention is that it provides a photoelectric conversion element, a photoelectric conversion device, and an image sensor that have improved detection capability, for example, for detecting infrared rays.

According to a first aspect of the invention, there is provided a photoelectric conversion element including: a light receiving layer that is formed of microcrystal semiconductor; a first semiconductor layer of a first conductive type that is formed on one face side of the light receiving layer; and a first intermediate layer that is interposed between the first semiconductor layer and the light receiving layer and is formed of amorphous semiconductor.

According to the above-described photoelectric conversion element, the light receiving layer, for example, is configured by microcrystal semiconductor such as microcrystal silicon (hereinafter, referred to as "μC-Si") instead of an amorphous semiconductor layer such as an amorphous silicon layer. By using such a light receiving layer, it is possible to improve the light receiving sensitivity for infrared rays, compared to the case where an amorphous semiconductor layer such as an amorphous silicon layer is used.

The first semiconductor layer is a semiconductor layer such as an n-type amorphous silicon layer and is formed on one face side of the light receiving layer.

The first intermediate layer is interposed between the first semiconductor layer and the light receiving layer. For example, the first intermediate layer is configured by amorphous semiconductor such as amorphous silicon. By using such a first intermediate layer, an increase in the leakage current that is generated by using the microcrystal semiconductor in the light receiving layer can be suppressed.

As a result, according to the above-described photoelectric conversion element, the light receiving sensitivity for infrared rays can be increased, small amounts of light can be detected, and the detection capability for detecting a detection target can be improved.

The above photoelectric conversion element may further include: a second semiconductor layer of a second conductive type that is formed on the other face side of the light receiving layer; and a second intermediate layer that is interposed between the second semiconductor layer and the light receiving layer and is formed of amorphous semiconductor.

In such a case, the first intermediate layer and the second intermediate layer are formed on one face side of the light receiving layer and the other face side thereof. Accordingly, the generation of the leakage current can be suppressed further, compared to the case where an intermediate layer is formed only on either one face side of the light receiving layer or the other face thereof.

The above-described photoelectric conversion element may further include a third semiconductor layer that is formed on the other face side of the light receiving layer and is a microcrystal semiconductor layer of a second conductive type.

In such a case, it is possible to improve the detection capability for infrared light, while the generation of the leakage current is suppressed.

According to a second aspect of the invention, there is provided a photoelectric conversion device including: a photoelectric conversion element, which includes a light receiving layer that is formed of microcrystal semiconductor, a first semiconductor layer of a first conductive type that is formed on one face side of the light receiving layer, a first intermediate layer that is interposed between the first semiconductor layer and the light receiving layer and is formed of amorphous semiconductor, a second semiconductor layer of a second conductive type that is formed on the other face side of the light receiving layer, and a second intermediate layer that is interposed between the second semiconductor layer and the light receiving layer and is formed of amorphous semiconductor; a conductive part that is electrically connected to the second semiconductor layer; and a thin film transistor that is electrically connected to the photoelectric conversion element through the conductive part and drives the photoelectric conversion element. In addition, the thin film transistor has a semiconductor layer that is formed of poly silicon.

According to the above-described photoelectric conversion device, the light receiving sensitivity for infrared rays can be increased, small amounts of light can be detected, and the detection capability for detecting a detection target can be improved when the thin film transistor having a semiconductor layer formed of poly silicon is used, similar to the above-described photoelectric conversion element.

According to a third aspect of the invention, there is provided a photoelectric conversion device including: a photoelectric conversion element including a light receiving layer that is formed of microcrystal semiconductor, a first semiconductor layer of a first conductive type that is formed on one face side of the light receiving layer, a first intermediate layer that is interposed between the first semiconductor layer and the light receiving layer and is formed of amorphous semiconductor, and a third semiconductor layer that is formed on the other face side of the light receiving layer and is a microcrystal semiconductor layer of a second conductive type; a conductive part that is electrically connected to the third semiconductor layer; and a thin film transistor that is electrically connected to the photoelectric conversion element through the conductive part and drives the photoelectric conversion element. In addition, the thin film transistor has a semiconductor layer that is formed of poly silicon.

According to the above-described photoelectric conversion device, the light receiving sensitivity for infrared rays can be increased, small amounts of light can be detected, and the detection capability for detecting a detection target can be improved when the thin film transistor having a semiconductor layer formed of poly silicon is used, similar to the above-described photoelectric conversion element.

According to a fourth aspect of the invention, there is provided an image sensor including: a substrate; and a photoelectric conversion element including a light receiving layer that is formed of microcrystal semiconductor, a first semiconductor layer of a first conductive type that is formed on one face side of the light receiving layer, and a first intermediate layer that is interposed between the first semiconductor layer and the light receiving layer and is formed of amorphous semiconductor, which are formed in each of a plurality of unit areas that constitutes a light detecting area formed on the substrate.

According to the above-described image sensor, a minute amount of light can be detected while the detection capability for infrared rays is improved. As a result, according to the above-described image sensor, the overall light detecting capability of the image sensor can be improved.

The operations and other advantages according to an embodiment of the invention will be clarified based on the embodiment to be described.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a photoelectric conversion element, a photoelectric conversion device, and an image sensor according to embodiments of the invention will be described with reference to the accompanying drawings.

1. Image Sensor

Figure 1:
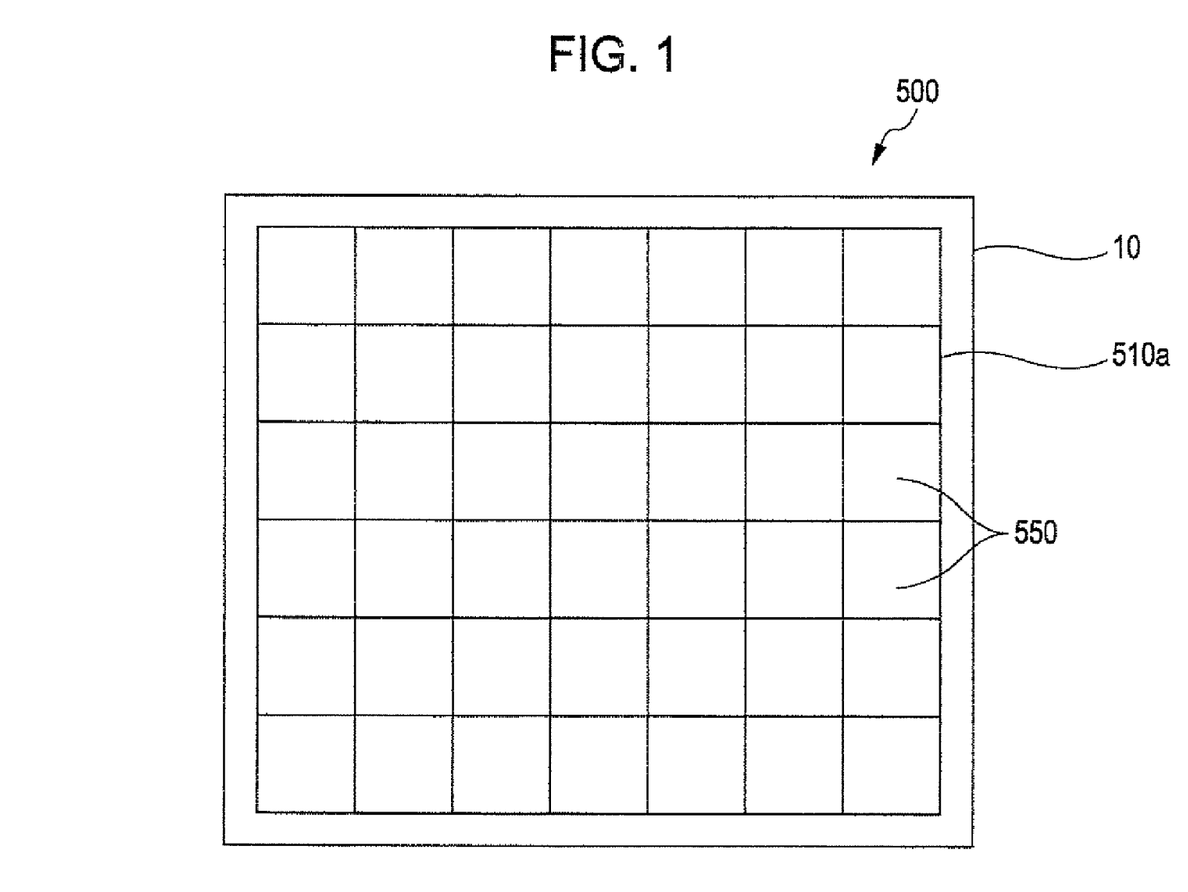
FIG. 1 is a plan view of an image sensor according to an embodiment of the invention.
Figure 2:
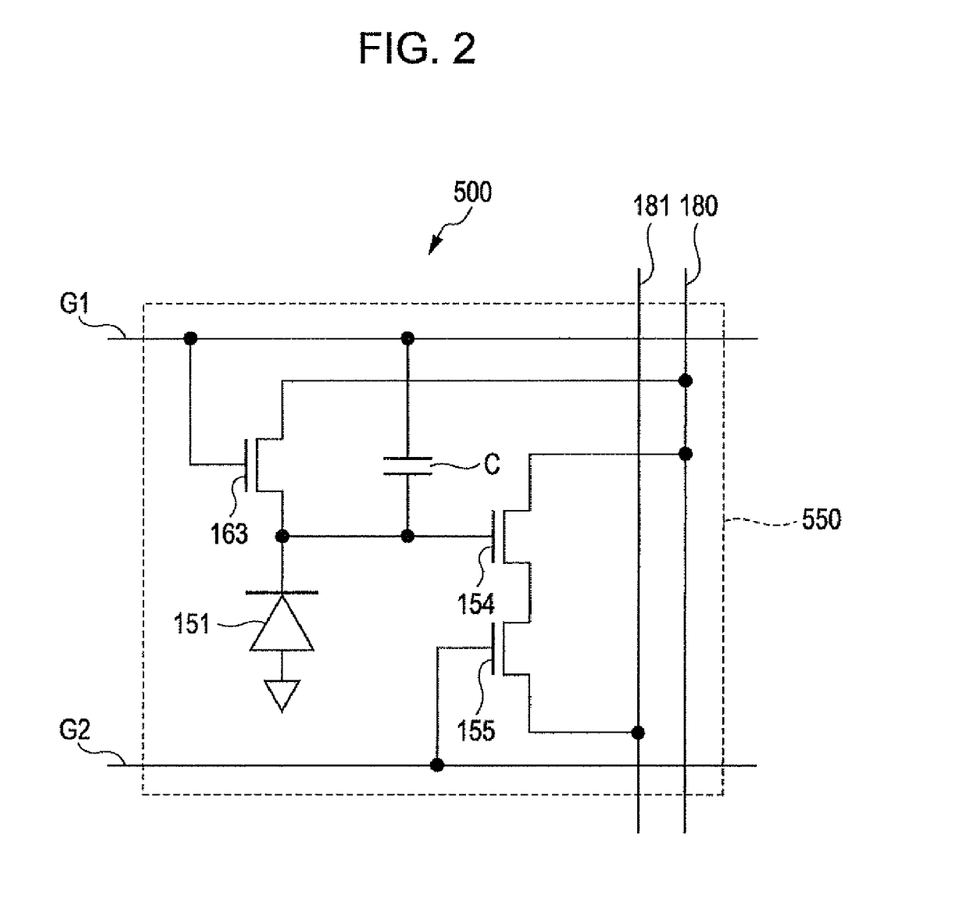
FIG. 2 is a circuit diagram showing the electrical configuration of unit areas of the image sensor according to this embodiment.

Here, an image sensor according to an embodiment of the invention will be described with reference to FIGS. 1 and 2. FIG. 1 is a plan view of the image sensor according to the embodiment. FIG. 2 is a circuit diagram showing the electrical configuration of unit areas of the image sensor according to this embodiment.

As shown in FIG. 1, the image sensor 500 includes a substrate 10 on which various circuit parts formed of semiconductor elements are formed. The substrate 10, for example, is a transparent substrate such as a glass substrate. On the substrate 10, a photo sensor and a driving TFT that drives the photo sensor, to be described later, are formed. An image detecting area 510a located on the substrate 10 is a typical example of a "light detecting area" according to an embodiment of the invention. The image detecting area 510a is constituted by a plurality of unit areas 550 that are arranged on the substrate 10 in a matrix shape. The photo sensor to be described later is formed in each of the plurality of unit areas 550. Since the image sensor 500 includes the photo sensor to be described later, the image sensor 500 can detect minute amounts of light while increasing the capability of detecting infrared rays. Therefore, according to the image sensor 500, it is possible to increase the overall light detecting capability of the image sensor.

As shown in FIG. 2, the image sensor 500 includes the photo sensor 151 as an example of the "photoelectric conversion element" according to an embodiment of the invention, a storage capacitor C, a reset TFT 163, a signal amplifier TFT 154, an output control TFT 155, an input line 180, an output line 181, and gate lines G1 and G2.

The photo sensor 151 is a PIN diode and detects incident light that is incident to the image detecting area 510a in accordance with an object that is the detection target. The source of the reset TFT 163 is electrically connected to the output side of the photo sensor 151 and the gate of the signal amplifier TFT 154. In addition, the gate of the reset TFT 163 is electrically connected to the gate line G1 that is used for the resetting operation. The drain of the reset TFT 163 is electrically connected to the input line 180. The source and the drain of the signal amplifier TFT 154 are electrically connected to the source of the output control TFT 155 and the input line 180. The source, the gate, and the drain of the output control TFT 155 are electrically connected to the drain of signal amplifier TFT 154, the gate line G2 for selection, and the output line 181. In addition, the storage capacitor C is electrically connected between the gate of the signal amplifier TFT 154 and the gate line G1.

In the case where the image sensor 500 operates, when the photo sensor 151 receives incident light, an optical current is generated in the photo sensor 151, and an output signal is output to the output line 181 in accordance with the operations of the reset TFT 163, the signal amplifier TFT 154, and the output control TFT 155. An object, which is the detection target, is imaged based on the output signals output from the plurality of unit areas 550. According to the image sensor 500, the detection capability for infrared light is improved. Accordingly, even under a situation in which an object cannot be easily detected by using visible light, the object that is the detection target can be detected accurately.

2. Photoelectric Conversion Device

Figure 3:
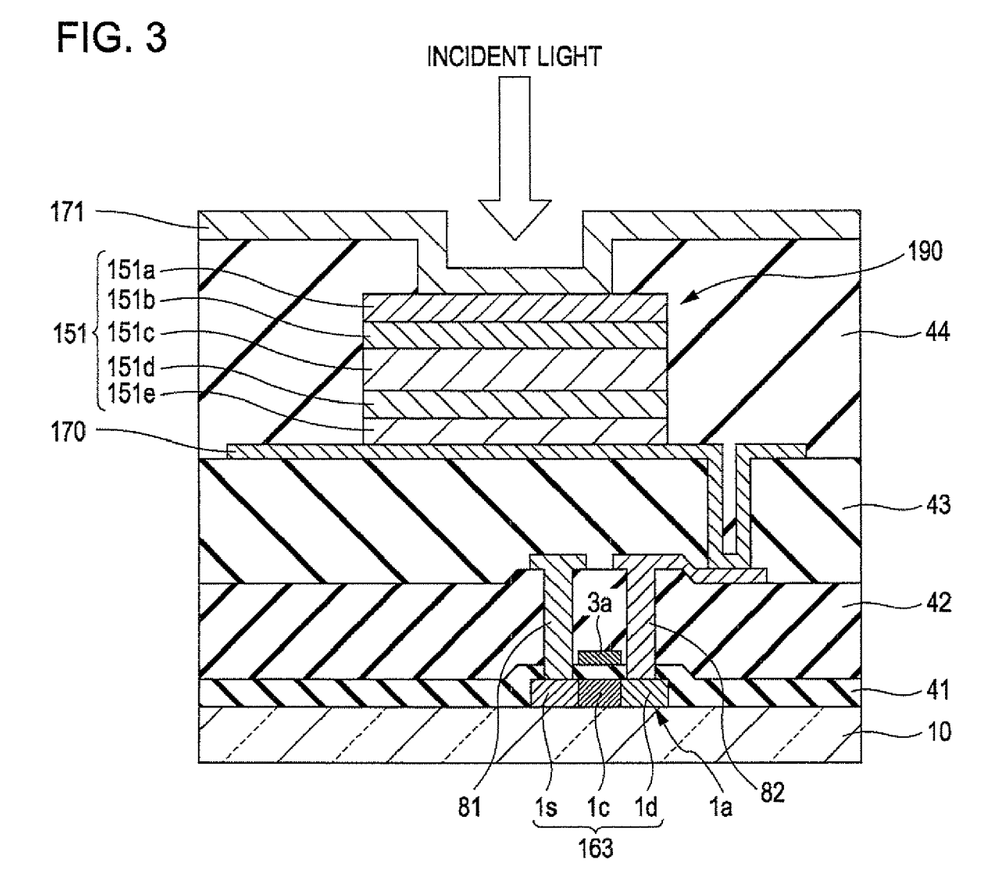
FIG. 3 is a cross-sectional view showing the configuration of a photoelectric conversion device according to this embodiment.

Next, as a photoelectric conversion device according to an embodiment of the invention, a photoelectric conversion device that is mounted in the above-described image sensor will be described with reference to FIG. 3. FIG. 3 is a cross-sectional view of a unit area of the image sensor according to this embodiment. The photoelectric conversion device according to this embodiment is configured to include the above-described photo sensor 151.

As shown in FIG. 3, a photoelectric conversion device 190 includes the photo sensor 151 that is an example of the "photoelectric conversion element" according to an embodiment of the invention, an anode 170 that is an example of a "conductive part" according to an embodiment of the invention, and the reset TFT 163 that is an example of the "thin film transistor" according to an embodiment of the invention.

The photo sensor 151 is configured to include a light receiving layer 151c, a first semiconductor layer 151a, a first intermediate layer 151b, a second semiconductor layer 151e, and a second intermediate layer 151d. The photo sensor 151 is electrically connected to the anode 170 and a cathode 171 that is formed of ITO (indium tin oxide).

The light receiving layer 151c is configured from microcrystal semiconductor such as microcrystal silicon (hereinafter, referred to as "μC-Si") instead of an amorphous semiconductor layer such as an amorphous silicon layer. By using such a light receiving layer 151c, it is possible to improve the light receiving sensitivity for incident light including infrared rays, compared to the case where an amorphous semiconductor layer such as an amorphous silicon layer is used.

The first semiconductor layer 151a is an n-type semiconductor layer that is formed on one face side of the light receiving layer 151c. For example, the first semiconductor layer 151a is formed of amorphous silicon. The first intermediate layer 151b is interposed between the first semiconductor layer 151a and the light receiving layer 151c. The first intermediate layer 151b configures a bonding layer that bonds the first semiconductor layer 151a and the light receiving layer 151c together. The first intermediate layer 151b is formed of amorphous semiconductor such as amorphous silicon.

Therefore, according to the photo sensor 151, an increase in the leakage current that is generated by the forming of the light receiving layer 151c by using the microcrystal semiconductor such as μC-Si can be suppressed by the placing of the first intermediate layer 151b. Thus, according to the photo sensor 151, the light receiving sensitivity for infrared rays can be increased, small amounts of light can be detected, and the detection capability for detecting a detection target can be improved.

The second semiconductor layer 151e is a p-type semiconductor layer that is formed on the other face side of the light receiving layer 151c. For example, the second semiconductor layer 151e is configured from amorphous silicon. The second intermediate layer 151d is interposed between the second semiconductor layer 151e and the light receiving layer 151c. The second intermediate layer 151d configures a bonding layer that bonds the second semiconductor layer 151e and the light receiving layer 151c. The second intermediate layer 151d, similar to the first intermediate layer 151b, is configured from amorphous semiconductor such as amorphous silicon.

According to the photo sensor 151, the first intermediate layer 151b and the second intermediate layer 151d are formed on one face side of the light receiving layer 151c and the other face side thereof. Accordingly, generation of the leakage current can be suppressed further, compared to the case where an intermediate layer is formed only on either one face side of the light receiving layer 151c or the other face side thereof, and whereby small amounts of light can be detected.

The anode 170 is formed on an insulating film 43 among a gate insulating film 41 and insulating films 42, 43, and 44 that are formed on the substrate 10. The anode 170 is electrically connected to a drain terminal 82 of the reset TFT 163 through a contact hole that is formed in the insulating film 43.

The reset TFT 163 is electrically connected to the photo sensor 151 through the anode 170. The reset TFT 163 resets the photo sensor 151 at the time of the operation of the image sensor 500. The reset TFT 163 includes a source terminal 81 that is electrically connected to a source area, a drain terminal 82 that is electrically connected to a drain side, a gate electrode 3a, and a semiconductor layer 1a on which the source area 1s, a channel area 1c, and a drain area 1d are formed. The semiconductor layer 1a is configured from poly silicon.

Thus, according to the photoelectric conversion device 190, while the TFT having the semiconductor layer formed of poly silicon is being used, the light receiving sensitivity for infrared rays can be increased, small amounts of light can be detected, and the detection capability for detecting a detection target can be improved.

MODIFIED EXAMPLES

Figure 4:
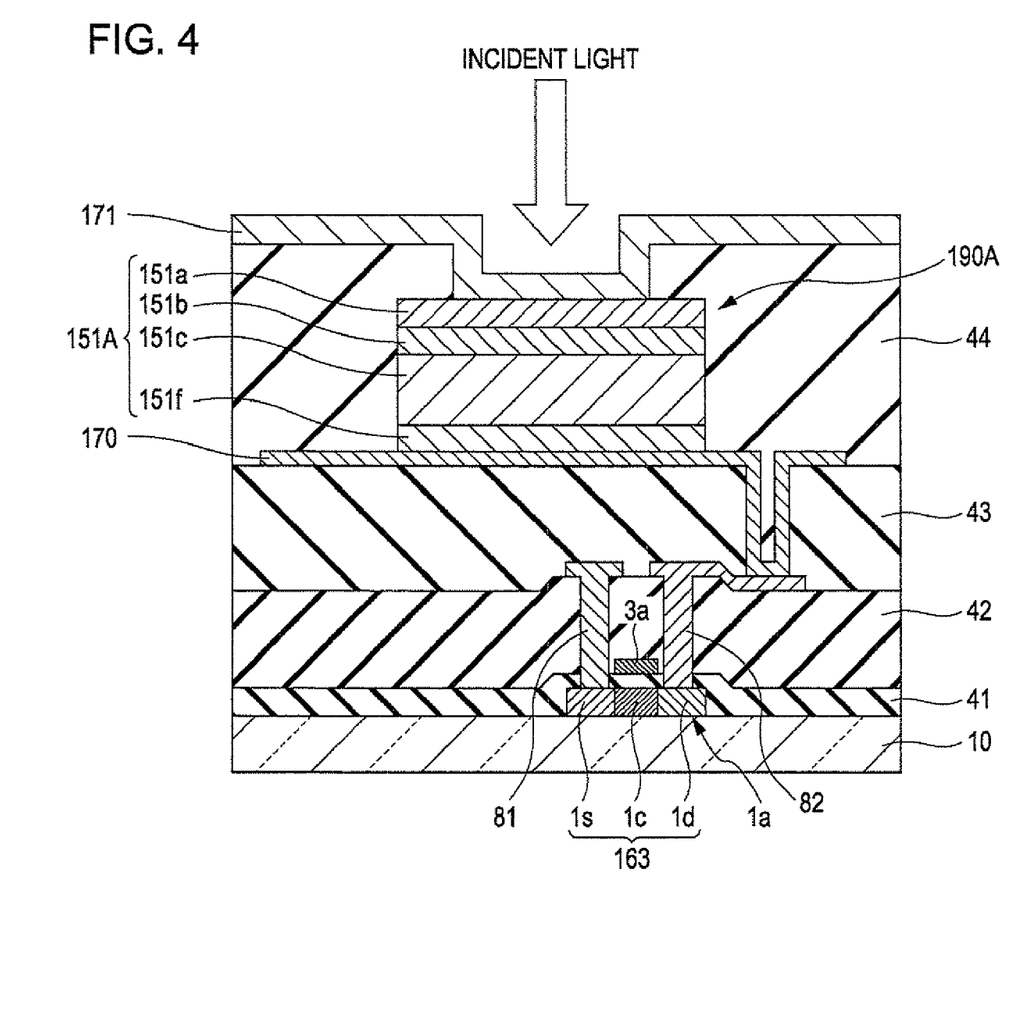
FIG. 4 is a cross-sectional view showing the configuration of a photoelectric conversion device according to a modified example of this embodiment.
Figure 5:
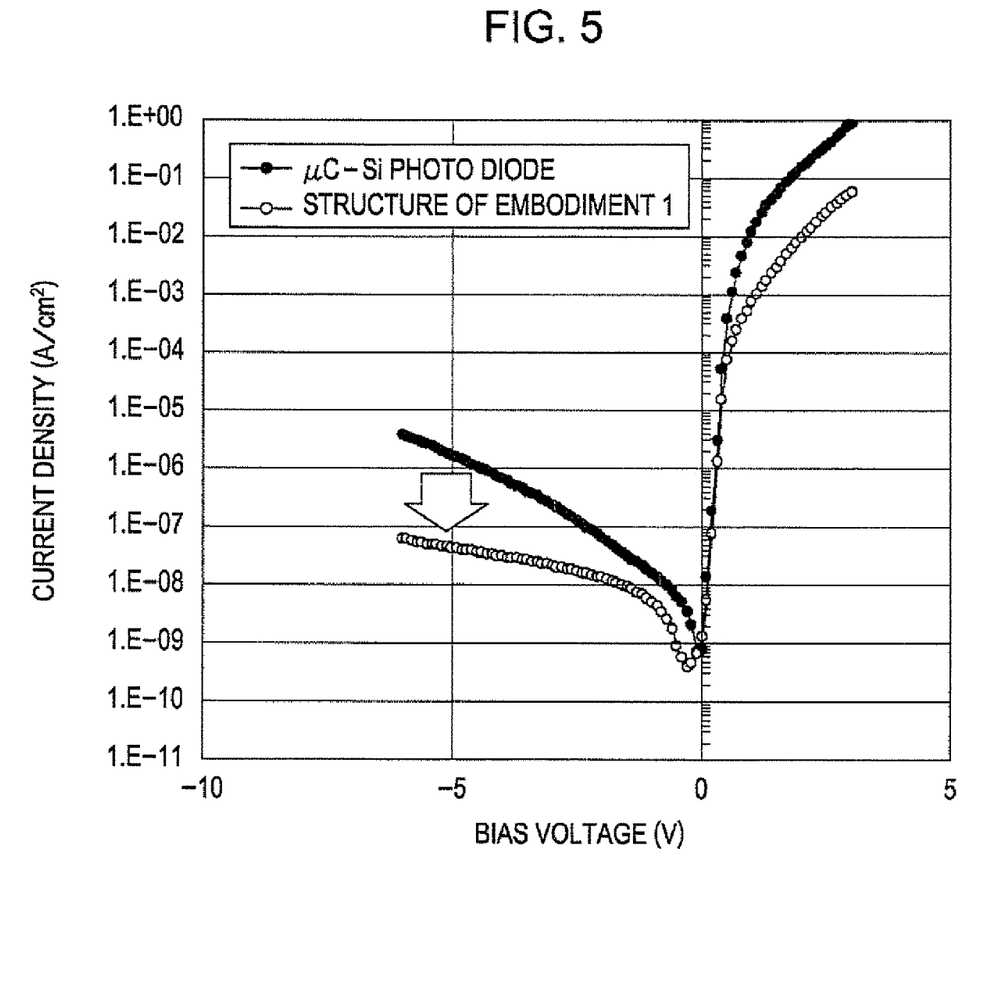
FIG. 5 is a graph showing the characteristic of the photoelectric conversion device according to a modified example of this embodiment in the relationship between bias voltage and current density.

Next, a modified example of the photoelectric conversion device according to this embodiment will be described with reference to FIGS. 4 and 5. FIG. 4 is a cross-sectional view showing the configuration of a photoelectric conversion device 190A according to this example. FIG. 5 is a graph showing the characteristic of the photoelectric conversion device 190A according to this example in the relationship between bias voltage and current density. Hereinafter, a common reference sign is attached to each part that is common to the above-described photoelectric conversion device 190, and a description thereof is omitted here.

As shown in FIG. 4, the photoelectric conversion device 190A according to this example includes a photo sensor 151A, which is different from the above-described photoelectric conversion device 190.

In the photo sensor 151A, any intermediate layer is not disposed on both sides of the light receiving layer 151c. In the photo sensor 151A, a first intermediate layer 151b is formed only on one face side of the light receiving layer 151c, and only a p-type third semiconductor layer 151f is formed on the other face side, which is different from the photo sensor 151. The third semiconductor layer 151f is configured from p-type μC-Si and is electrically connected to the anode 170.

Figure 6:
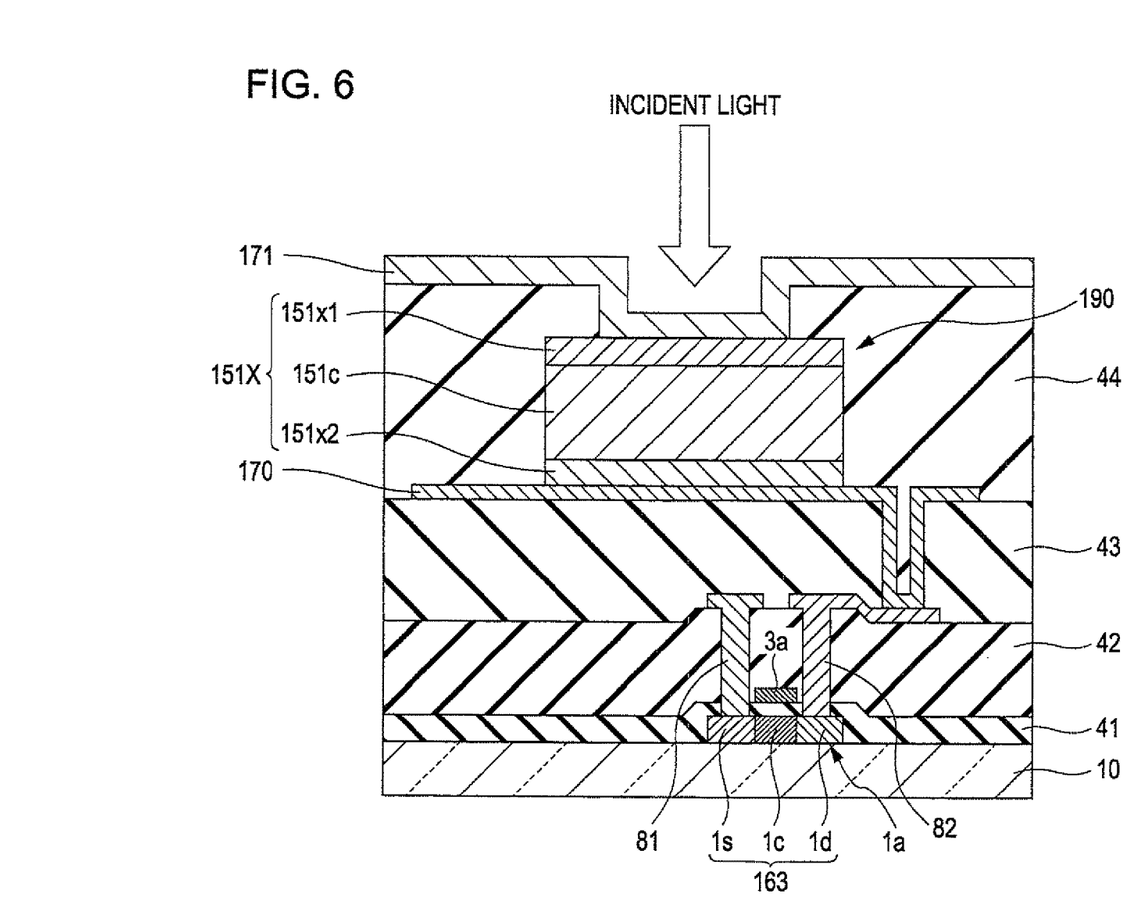
FIG. 6 is a cross-sectional view showing the configuration of a comparative example of a photoelectric conversion device according to this embodiment.

Next, the relationship between the bias voltage and the current density of the photo sensor 151A will be described with reference to FIG. 5. Here, the bias voltage represents a voltage that is applied to the anode 170 when the electric potential of the cathode 171 is used as a reference (0 V). In FIG. 5, the relationship (the structure of Embodiment 1) between the bias voltage and the current density of the photo sensor 151A is denoted by white dots, and the relationship between the bias voltage and the current density of the μC-Si photo diode, used as a comparative example, is denoted by black dots. In addition, the μC-Si photo diode 151X according to this comparative example, as shown in FIG. 6, has a configuration in which any intermediate layer formed of amorphous semiconductor such as amorphous silicon is not formed on both faces of the light receiving layer 151c. In particular, the μC-Si photo diode 151X according to this comparative example has an n-type μC-Si 151x1 and a p-type μC-Si 152x2 on both faces of the light receiving layer 151c.

As shown in FIG. 5, according to the photo sensor 151A, compared to the photo diode used as a comparative example, the current density of the current that is generated at the negative bias voltage is decreased. Therefore, according to the photo sensor 151A in this example, the light receiving sensitivity for infrared rays is higher, and the generation of the leakage current can be suppressed. In addition, the current density of the current, which is generated at the negative bias voltage, of the photo sensor 151 in which the intermediate layers are formed on both face sides of the light receiving layer 151c is predicted to be naturally lower than that of the photo sensor 151A.

As a result, according to the photoelectric conversion devices 190 and 190A that have the photo sensors 151 and 151A of this embodiment, the detection capability for infrared rays can be improved while the generation of the leakage current at the time of the operation of the image sensor 500 is suppressed.

What is claimed is:

1. A photoelectric conversion element comprising:
   a light receiving layer that is formed of microcrystal silicon;
   a first semiconductor layer of a first conductive type that is formed on one face side of the light receiving layer;
   a first intermediate layer that is interposed between, and is in direct contact with both, the first semiconductor layer and the light receiving layer;
   a second semiconductor layer of a second conductive type that is formed on the other face side of the light receiving layer; and
   a second intermediate layer that is interposed between, and is in direct contact with both, the second semiconductor layer and the light receiving layer, wherein
      each of the first semiconductor layer, the first intermediate layer, the second semiconductor layer, and the second intermediate layer are formed of amorphous silicon.

2. The photoelectric conversion element according to claim 1, further comprising:
   a third semiconductor layer that is formed on the other face side of the light receiving layer, the third semiconductor layer being a microcrystal semiconductor layer of a second conductive type.

3. A photoelectric conversion device comprising:
   a photoelectric conversion element, the photoelectric conversion element further comprising:
      a light receiving layer that is formed of microcrystal silicon;
      a first semiconductor layer of a first conductive type that is formed on one face side of the light receiving layer;
      a first intermediate layer that is interposed between, and is in direct contact with both, the first semiconductor layer and the light receiving layer; and
      a second semiconductor layer of a second conductive type that is formed on the other face side of the light receiving layer;
   a conductive part that is electrically connected to the second semiconductor layer;
   a thin film transistor that is electrically connected to the photoelectric conversion element through the conductive part and drives the photoelectric conversion element; and
   a second intermediate layer that is interposed between, and is in direct contact with both, the second semiconductor layer and the light receiving layer, wherein
      each of the first semiconductor layer, the first intermediate layer, the second semiconductor layer and the second intermediate layer are formed of amorphous silicon.

4. The photoelectric conversion device according to claim 3, wherein the thin film transistor has a semiconductor layer that is formed of poly silicon.

5. An image sensor comprising:
   a substrate; and
   a photoelectric conversion element, wherein the photoelectric conversion element further comprises:
      a light receiving layer that is formed of microcrystal semiconductor;
      a first semiconductor layer of a first conductive type that is formed on one face side of the light receiving layer;
      a first intermediate layer that is interposed between, and is in direct contact with both, the first semiconductor layer and the light receiving layer;
      a second semiconductor layer that is formed on another face side of the light receiving layer; and
      a second intermediate layer that is interposed between, and is in direct contact with both, the second semiconductor layer and the light receiving layer, wherein
         each of the first semiconductor layer, the first intermediate layer, the second semiconductor layer, and the second intermediate layer are formed of an amorphous semiconductor.

* * * * *